United States Patent
Wright et al.

(10) Patent No.: US 12,040,154 B2
(45) Date of Patent: *Jul. 16, 2024

(54) HYBRID ION SOURCE FOR ALUMINUM ION GENERATION USING ORGANOALUMINIUM COMPOUNDS AND A SOLID TARGET

(71) Applicant: Applied Materials, Inc., Santa Clara, CA (US)

(72) Inventors: Graham Wright, Newburyport, MA (US); Shardul S. Patel, Chelmsford, MA (US)

(73) Assignee: Applied Materials, Inc., Santa Clara, CA (US)

( * ) Notice: Subject to any disclaimer, the term of this patent is extended or adjusted under 35 U.S.C. 154(b) by 115 days.

This patent is subject to a terminal disclaimer.

(21) Appl. No.: 17/740,854

(22) Filed: May 10, 2022

(65) Prior Publication Data
US 2023/0369007 A1 Nov. 16, 2023

(51) Int. Cl.
*H01J 37/32* (2006.01)
*H01J 37/08* (2006.01)

(52) U.S. Cl.
CPC .......... *H01J 37/08* (2013.01); *H01J 37/3244* (2013.01); *H01J 2237/063* (2013.01)

(58) Field of Classification Search
CPC .... H01J 37/08; H01J 37/3171; H01J 37/3244; H01J 37/32458; H01J 37/32669; H01J 37/32862; H01J 2237/061; H01J 2237/063; H01J 2237/06308; H01J 2237/0815; H01J 2237/083

See application file for complete search history.

(56) References Cited

U.S. PATENT DOCUMENTS

| 8,759,788 B1 * | 6/2014 | Bassom | H01J 27/08 315/111.21 |
|---|---|---|---|
| 10,600,611 B2 | 3/2020 | Becker et al. | |
| 10,957,509 B1 | 3/2021 | Wright et al. | |

(Continued)

FOREIGN PATENT DOCUMENTS

| CN | 102844842 A | 12/2012 |
|---|---|---|
| JP | 2019-139943 A | 8/2019 |

(Continued)

OTHER PUBLICATIONS

International Search Report and Written Opinion mailed Jan. 4, 2024 in corresponding PCT application No. PCT/US2023/018513.

(Continued)

*Primary Examiner* — Tung X Le
(74) *Attorney, Agent, or Firm* — NIELDS, LEMACK & FRAME, LLC (57) ABSTRACT

An ion source that is capable of different modes of operation is disclosed. A solid target may be disposed in the arc chamber. The ion source may have several gas inlets, in communication with different gasses. When operating in a first mode, the ion source may supply a first gas, such as a halogen containing gas. When operating in a second mode, the ion source may supply an organoaluminium gas. Ions having single charges may be created in the first mode, while ions having multiple charges may be created in the second mode. In some embodiments, the solid target may be retractable.

19 Claims, 6 Drawing Sheets

(56) References Cited

U.S. PATENT DOCUMENTS

| | | |
|---|---|---|
| 11,170,973 B2 | 11/2021 | Patel et al. |
| 11,404,254 B2 | 8/2022 | Patel et al. |
| 2004/0187782 A1 | 9/2004 | McLeod et al. |
| 2006/0169915 A1 | 8/2006 | Olson et al. |
| 2008/0142702 A1 | 6/2008 | Frosien et al. |
| 2010/0025576 A1 | 2/2010 | Adams |
| 2010/0108902 A1 | 5/2010 | Frosien et al. |
| 2010/0320395 A1 | 12/2010 | Hahto et al. |
| 2011/0260047 A1 | 10/2011 | Lee |
| 2012/0235058 A1 | 9/2012 | Sinha et al. |
| 2013/0140473 A1 | 6/2013 | Colvin et al. |
| 2014/0110598 A1 | 4/2014 | Wu et al. |
| 2014/0151572 A1* | 6/2014 | Lin ............ H01J 37/08 250/423 R |
| 2015/0008332 A1 | 1/2015 | Notte, IV et al. |
| 2015/0034837 A1* | 2/2015 | Koo ............ H01J 27/205 250/424 |
| 2015/0270111 A1 | 9/2015 | Wood |
| 2019/0180971 A1 | 6/2019 | Becker et al. |
| 2020/0090916 A1* | 3/2020 | Patel ............ H01J 37/08 |
| 2020/0303154 A1* | 9/2020 | Bassom ............ H01J 37/3002 |
| 2020/0388468 A1* | 12/2020 | Sporleder ............ H01J 37/3244 |
| 2021/0375585 A1 | 12/2021 | Patel et al. |
| 2022/0139664 A1 | 5/2022 | Colvin et al. |
| 2023/0369006 A1 | 11/2023 | Wright et al. |
| 2023/0369008 A1 | 11/2023 | Wright et al. |
| 2023/0395357 A1 | 12/2023 | Wright et al. |

FOREIGN PATENT DOCUMENTS

| | | |
|---|---|---|
| TW | 201234400 A | 8/2012 |
| WO | 2021/045873 A1 | 3/2021 |

OTHER PUBLICATIONS

International Search Report and Written Opinion mailed Aug. 2, 2023 in co-pending PCT application No. PCT/US2023/018516.

International Search Report and Written Opinion mailed Aug. 28, 2023 in co-pending PCT application No. PCT/US2023/021102.

International Search Report and Written Opinion mailed Aug. 1, 2023 in co-pending PCT application No. PCT/US2023/018511.

\* cited by examiner

HYBRID ION SOURCE FOR ALUMINUM ION GENERATION USING ORGANOALUMINIUM COMPOUNDS AND A SOLID TARGET

FIELD

Embodiments of the present disclosure relate to an ion source and more particularly, an ion source having multiple modes to generate ions of a species having different charges.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

In certain embodiments, it may be desirable to create ions that have a single charge. However, in other embodiments, it may be desirable to create ions that are multicharged. Unfortunately, for certain materials, such as aluminum and other metals, the mechanisms that are used to create singly charged ions may not be effective in creating multicharged ions. Therefore, different ion sources may be utilized depending on the desired charge of the extracted ions.

This solution is expensive as it utilizes several ion sources. Further, this solution is time consuming, as it takes time to switch from one ion source to a different ion source.

Therefore, a single ion source that is capable of operating in different modes in order to generate ions having different charges would be beneficial. Additionally, it would be advantageous if the arc chamber could be changed from one mode to another quickly.

SUMMARY

An ion source that is capable of different modes of operation is disclosed. A solid target comprising a compound containing the dopant of interest may be disposed in the arc chamber. The ion source may have several gas inlets, in communication with different gasses. When operating in a first mode, the ion source may supply a first gas, such as a halogen containing gas. When operating in a second mode, the ion source may supply an organoaluminium gas. Ions having single charges may be created in the first mode, while ions having multiple charges may be created in the second mode. In some embodiments, the solid target may be retractable.

According to one embodiment, an indirectly heated cathode ion source is disclosed. The ion source comprises an arc chamber, comprising a plurality of walls and adapted to contain a solid target; an indirectly heated cathode disposed in the arc chamber; a first valve in communication with the arc chamber and a first gas source; a second valve in communication with the arc chamber and a second gas source; and a controller in communication with the first valve and the second valve so as to operate the indirectly heated cathode ion source in one of a plurality of modes. In some embodiments, the plurality of modes comprises a single charge mode to create ions of a species having a single charge and a multicharge mode to create ions of the species having two or more charges. In some embodiments, the species comprises a metal. In certain embodiments, in the single charge mode, the controller opens the first valve and closes the second valve. In certain embodiments, in the multicharge mode, the controller closes the first valve and opens the second valve. In some embodiments, the ion source includes the solid target. In some embodiments, the solid target is mounted on one of the plurality of walls. In some embodiments, the solid target is mounted on an end of the arc chamber opposite the indirectly heated cathode. In certain embodiments, the solid target comprises a ceramic material comprising a metal and the metal is also a component of a second gas contained in the second gas source. In some embodiments, the metal is aluminum and the ceramic material is aluminum oxide or aluminum nitride. In certain embodiments, the first gas source contains a halogen containing species and the second gas source contains dimethylaluminum chloride or trimethylaluminum chloride. In some embodiments, the ion source comprises a retractable arm on which the solid target is disposed, and wherein the plurality of modes comprises a second single charge mode to create ions of a species having a single charge, wherein in the second single charge mode, the controller retracts the retractable arm and opens the second valve.

According to another embodiment, a method of operating an indirectly heated cathode ion source in a plurality of modes, wherein the indirectly heated cathode ion source comprises a controller, and an arc chamber adapted to contain a solid target comprising a metal, is disclosed. The method comprises selecting a desired mode of operation; and using the controller to configure the indirectly heated cathode ion source to operate in the desired mode, wherein to operate in a multicharge mode, wherein the multicharge mode is used to create ions of a species having two or more charges, the solid target is disposed in the arc chamber and the controller enables a flow of a first gas containing the metal into the arc chamber; and wherein to operate in a single charge mode, wherein the single charge mode is to create ions of the species having a single charge, the controller either removes the solid target from the arc chamber or uses a second gas to generate a plasma. In some embodiments, the second gas comprises a halogen containing species. In some embodiments, the metal is aluminum and the solid target is aluminum oxide or aluminum nitride. In certain embodiments, the first gas containing the metal comprises DMAC or TMAC.

According to another embodiment, an indirectly heated cathode ion source is disclosed. The ion source comprises an arc chamber, comprising a plurality of walls and adapted to contain a solid target; an indirectly heated cathode disposed in the arc chamber, wherein the indirectly heated cathode is used to generate a plasma in the arc chamber ; and a controller configured to operate the indirectly heated cathode ion source in one of a plurality of modes, wherein in multicharge mode, the controller configures the indirectly heated cathode ion source such that two sources of metal are used in a generation of a plasma. In some embodiments, the metal is aluminum, the solid target comprises aluminum oxide or aluminum nitride and wherein a gas containing aluminum and carbon is introduced into the arc chamber when operating in the multicharge mode. In some embodiments, the controller controls an actuator so as to insert and remove the solid target from the arc chamber. In certain embodiments, in a single charge mode, only one of the two sources is introduced into the arc chamber.

BRIEF DESCRIPTION OF THE FIGURES

For a better understanding of the present disclosure, reference is made to the accompanying drawings, which are incorporated herein by reference and in which.

DETAILED DESCRIPTION

As noted above, certain dopants, such as aluminum and other metals, utilize different mechanisms to create singly charged ions and multicharged ions.

Figure 1:
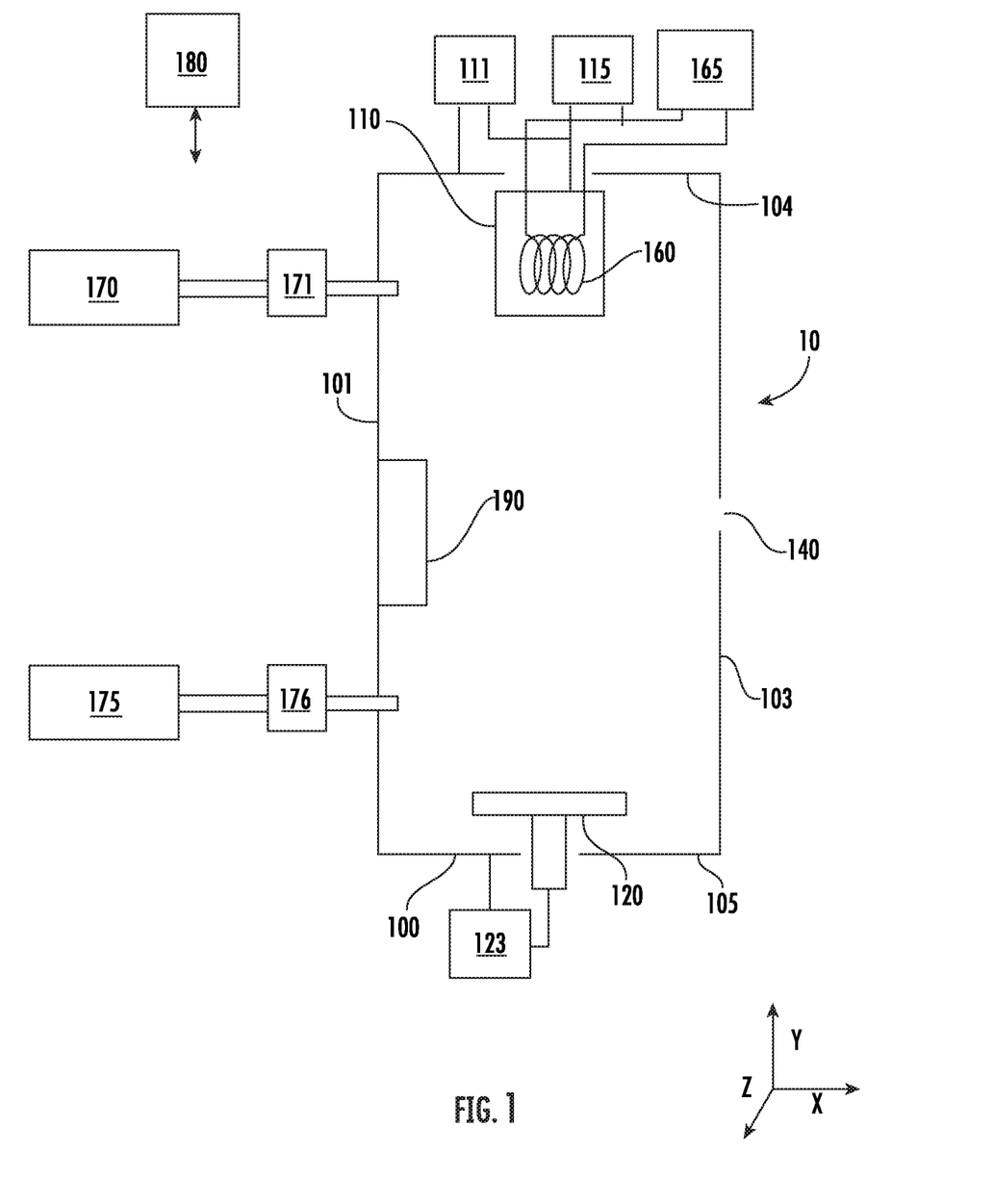
FIG. 1 is an indirectly heated cathode (IHC) ion source having several modes of operation in accordance with one embodiment.

FIG. 1 shows an IHC ion source 10 that overcomes these issues. The IHC ion source 10 includes an arc chamber 100, comprising two opposite ends, and walls 101 connecting to these ends. The walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the walls 101 from the first end 104 to the second end 105. For example, electrons may be confined in a column that is parallel to the direction from the cathode 110 to the repeller 120 (i.e. the y direction). Thus, electrons do not experience any electromagnetic force to move in the y direction. However, movement of the electrons in other directions may experience an electromagnetic force.

Disposed on one side of the arc chamber 100, referred to as the extraction plate 103, may be an extraction aperture 140. In FIG. 1, the extraction aperture 140 is disposed on a side that is parallel to the Y-Z plane (perpendicular to the page).

Further, the IHC ion source 10 may be in communication with at least two gas sources. The first gas source 170 may contain a first gas, which may be a halogen containing gas. In certain embodiments, the first gas may be a fluorinated species, such as $PF_3$ or $NF_3$, or any other halogen-based gas. A first valve 171 may be utilized to control the flow of the first gas from the first gas source 170 to the IHC ion source 10. The second gas source 175 may contain a second gas that is an organoaluminium compound, which is a compound in which an aluminum atom is bonded with a carbon atom. In certain embodiments, the organoaluminium compound contains a halogen and aluminum. In certain embodiments, this second gas may be dimethylaluminum chloride (DMAC; $(CH_3)_2AlCl$) or trimethylaluminum chloride (TMAC; $(CH_3)_3AlCl$). Other gases that include a metal atom bonded to a carbon atom may also be used. In some embodiments, this second gas comprises carbon, a metal and a halogen. The second gas source 175 may also include various diluent gasses, such as hydrogen, argon or other gasses. In other words, the second gas source 175 contains the second gas, but may also include other gasses. A second valve 176 may be utilized to control the flow of the second gas from the second gas source 175 to the ion source 10. The first valve 171 and the second valve 176 may be mass flow controllers (MFC) such that the flow rate may be controlled.

Figure 5:
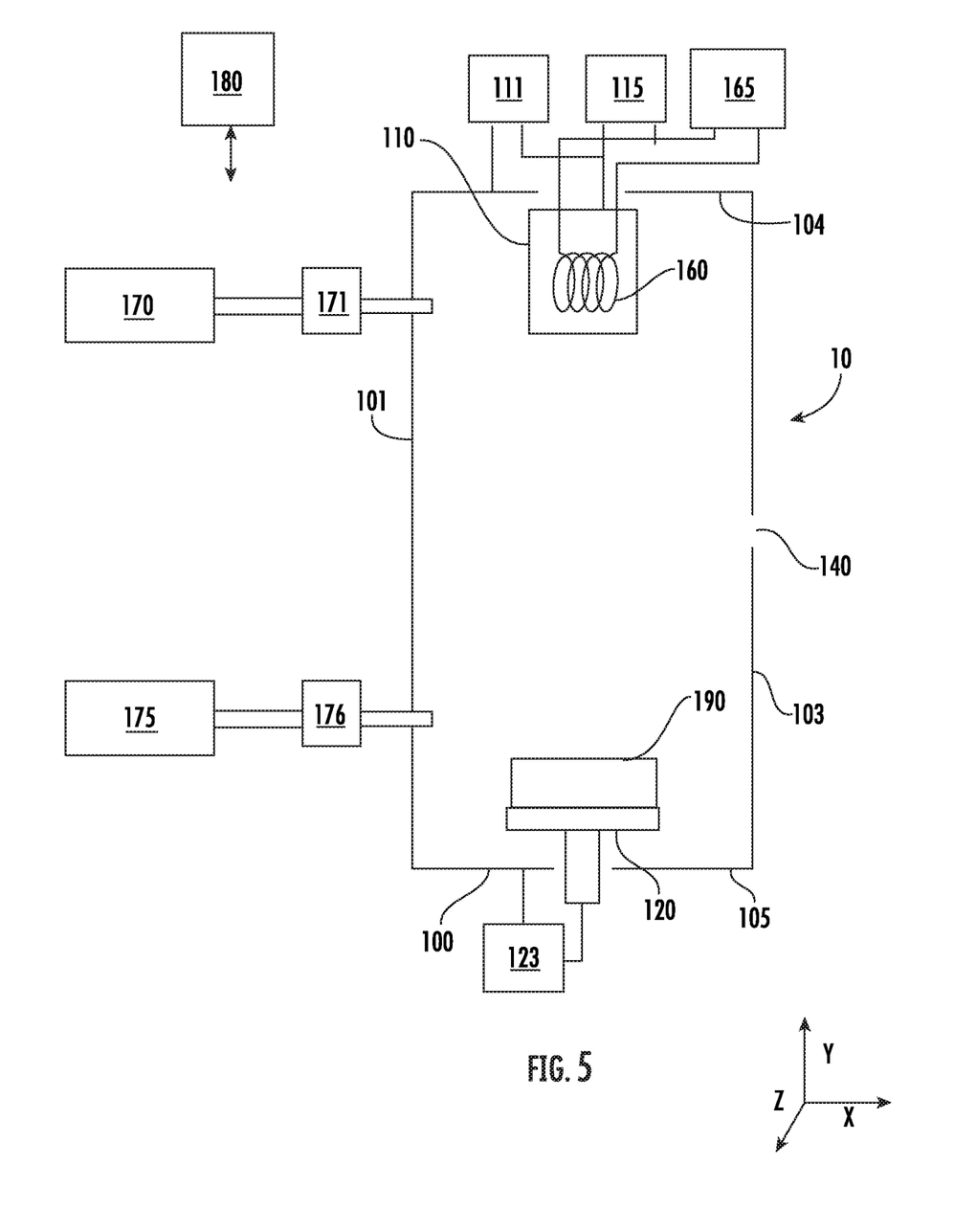
FIG. 5 is an indirectly heated cathode (IHC) ion source having several modes of operation in accordance with another embodiment.

A solid target 190 may be disposed within the arc chamber 100. In FIG. 1 the solid target 190 is shown disposed against the wall that is opposite the extraction plate 103. However, other embodiments are possible. For example, the solid target 190 may be disposed on a wall that is adjacent to the extraction plate 103. Further, in another embodiment, shown in FIG. 5, the solid target 190 may be disposed on the second end 105. In this embodiment, the solid target 190 may be disposed on the repeller 120. Alternatively, the solid target 190 may replace the repeller 120. The solid target 190 is a compound that comprises the dopant of interest. For example, the solid target 190 is a ceramic material that contains a metal. For example, in one embodiment, the metal may be aluminum and the solid target 190 may be aluminum oxide ($Al_2O_3$) or aluminum nitride (AlN).

A controller 180 may be in communication with one or more of the power supplies such that the voltage or current supplied by these power supplies may be modified. The controller 180 may also be in communication with the first valve 171 and the second valve 176. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

In the embodiment shown in FIG. 1, the controller 180 is configured to allow the ion source 10 to operate in a plurality of different modes. These modes include a single charge operating mode; and a multicharged operating mode. Each of these modes will be described in more detail.

In the single charge mode, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet that is in communication with the first valve 171.

The controller 180 opens the first valve 171 so as to allow the flow of the first gas into the arc chamber 100. The first gas is a halogen containing gas, which is useful in that it can effectively etch the solid target 190 and also provide a halogen, such as fluorine, to recycle aluminum from the walls of the arc chamber 100. The combination of electrons from the cathode 110, the first gas and the positive potential creates a plasma. This plasma serves to etch or sputter the solid target 190. The ions in this plasma may be mostly single charged ions, such as $Al^+$. In certain embodiments, the electrons and positive ions may be somewhat confined by a magnetic field. In certain embodiments, the plasma is confined near the center of the arc chamber 100, proximate the extraction aperture 140.

Thus, when it is desired to create single charged ions, such as $Al^+$, the operator may transmit this preference to the controller 180. Alternatively, the controller 180 may determine the desired mode based on the desired charge state and beam current. In response, the controller 180 may perform the sequence described above.

In multicharge mode, the controller 180 opens the second valve 176 so as to allow the flow of the second gas into the arc chamber 100. The first valve 171 may be open or may be closed in the multicharge mode. As noted above, the second gas may be a gas that contains the metal bonded to carbon. In some embodiments, the second gas may comprise carbon, the metal and a halogen. For example, if the metal is aluminum, the second gas may be DMAC or TMAC. These gasses are useful in that they provide a halogen to recycle aluminum from the walls of the arc chamber 100. The combination of electrons from the cathode 110, the second gas and the positive potential creates a plasma. In certain embodiments, the electrons and positive ions may be somewhat confined by a magnetic field. In certain embodiments, the plasma is confined near the center of the arc chamber 100, proximate the extraction aperture 140. Chemical etching or sputtering by the halogen in the plasma etches the solid target 190, adding dopant material to the plasma.

Because the second gas and the solid target 190 both contain the same metal, a plasma that is rich in this metal is created. Due to the density of the metal in the plasma, many of the ions that are created in the plasma may be multicharged ions, such as $Al^{++}$ or $Al^{+++}$. The ions can then be extracted through the extraction aperture 140 and used as an ion beam.

Thus, when it is desired to create multicharged ions, the operator may transmit this preference to the controller 180. In response, the controller 180 may perform the sequence described above.

Figure 3:
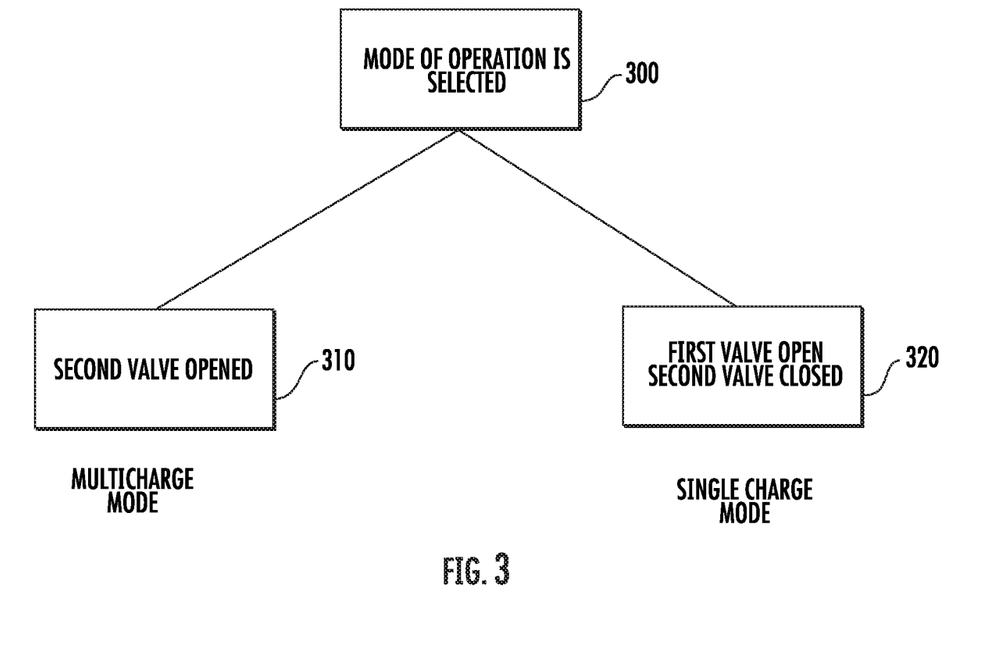
FIG. 3 shows the operation of the controller using the embodiment of FIG. 1.

Thus, with respect to the embodiment shown in FIG. 1, the present application describes two different modes of operation that may be used to generate different charge states of the desired dopant. Further, by incorporating the first gas, the second gas and a solid target 190 in the ion source 10, the ion source 10 can easily switch from one mode to another mode with no operator intervention. FIG. 3 shows the operation of the controller 180 to control the modes of the ion source 10 when the solid target 190 is disposed within the arc chamber 100. As shown in Box 300, the desired mode of operation is selected, which may depend on the recipe that is being used. This mode may be selected by the operator or user. Alternatively, the controller 180 may automatically select the most appropriate mode based on the desired beam current and charge state. Based on this selection, the controller 180 manipulates the first valve 171 and the second valve 176 to achieve the desired mode of operation.

As shown in Box 310, the multicharge mode may be selected, where plasma conditions are optimized for the generation of multicharged metal ions. In response, the controller 180 opens the second valve 176 to allow the flow of the second gas, which is a gas comprising the metal atoms bonded to carbon atoms, into the arc chamber 100. In this mode, the second gas may contain the metal, carbon and a halogen. Further, the halogen from the second gas serves to etch the solid target 190, adding more metal to the plasma. This metal-rich plasma is effective at creating multicharged ions.

Alternatively, as shown in Box 320, the single charge mode may be selected, where the majority of metal ions have a single charge. In response, the controller 180 opens the first valve 171 to allow the flow of the first gas, which is a halogen containing gas, such as a fluorinated gas, into the arc chamber 100. In this mode, the plasma causes the gas to ionize and etch the solid target 190, where the majority of the ions that are created are single charged ions.

Thus, to operate in the multicharge mode, the controller 180 configures the ion source 10 such that the metal is introduced by the second gas and the solid target. To operate in the single charge mode, the controller 180 configures the ion source 10 such that the metal is introduced only by the solid target 190.

The disclosure above describes two different modes of operation where the solid target 190 is mounted in the arc chamber 100. However, in another embodiment, the solid target 190 may be mounted on a retractable arm. This embodiment is shown in FIG. 2A-2B.

The solid target 190 rests on a retractable arm 210, which is in communication with an actuator 200. The actuator 200 has a first position, shown in FIG. 2A, where the solid target 190 is inside the arc chamber 100, and a second position, shown in FIG. 2B, where the solid target 190 is outside the arc chamber 100. The controller 180 is in communication with the actuator 200.

Figure 2A:
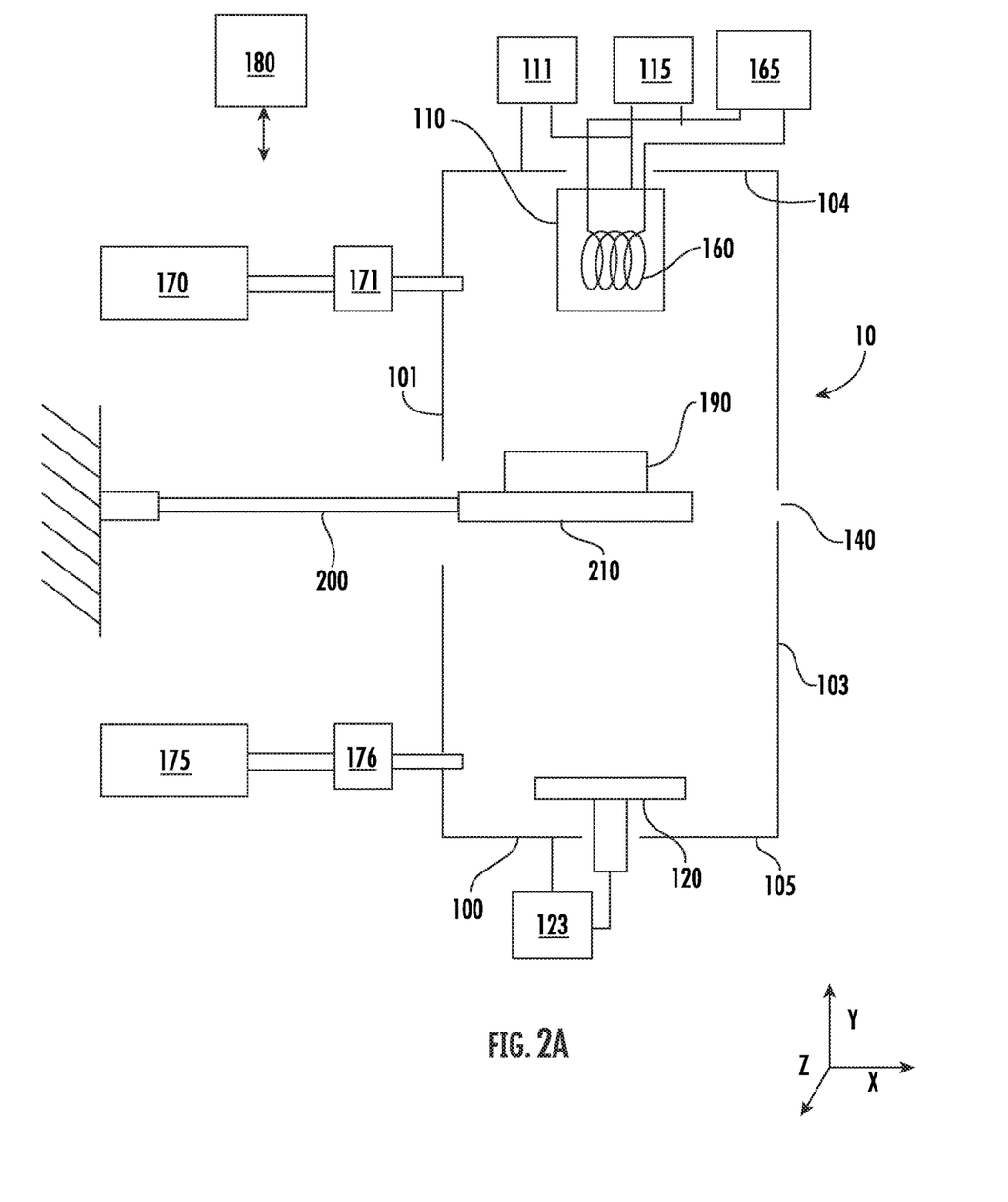
FIG. 2A-2B is an indirectly heated cathode (IHC) ion source having several modes of operation in accordance with another embodiment.
Figure 2B:
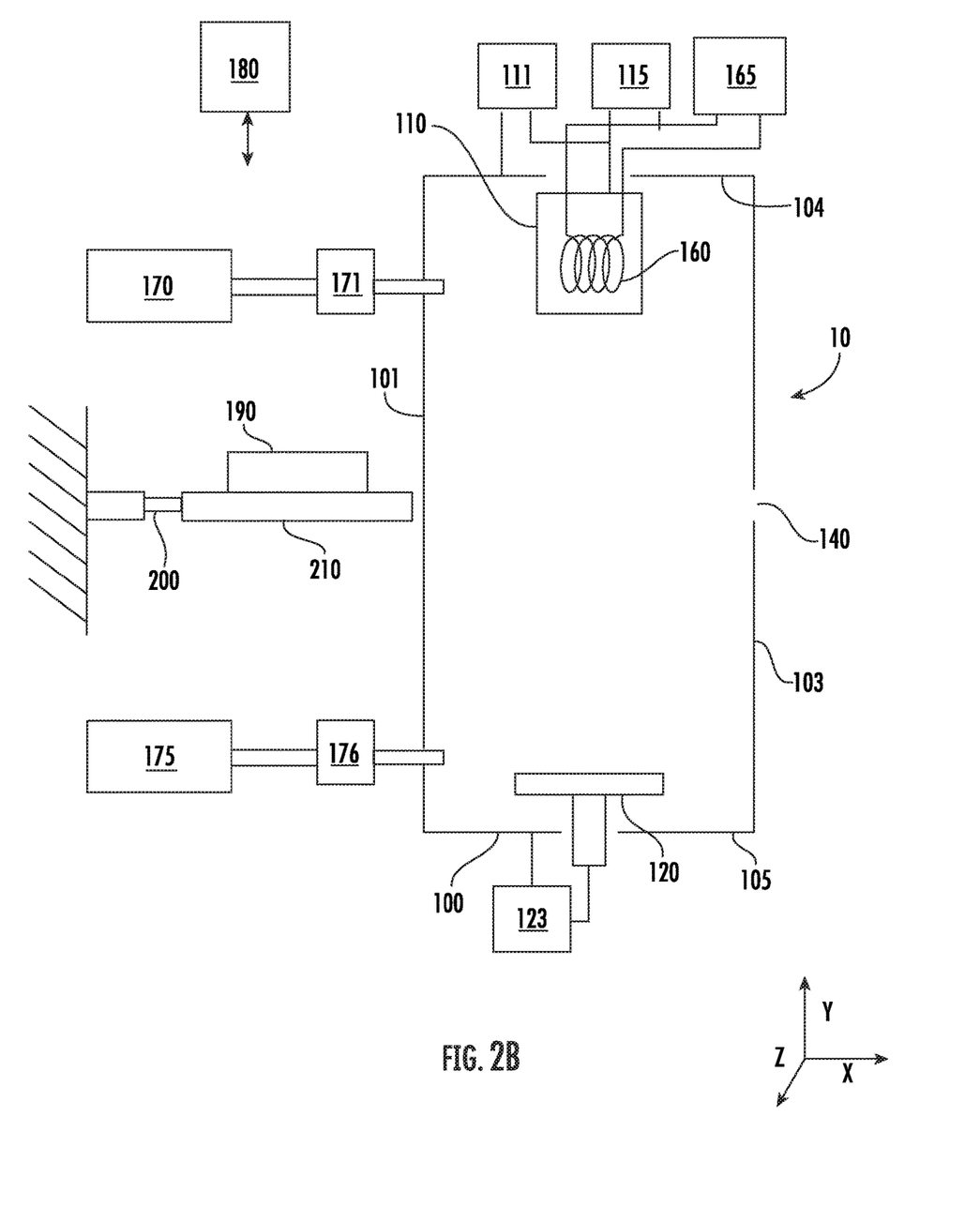

In the embodiment shown in FIGS. 2A-2B, the controller 180 is configured to allow the ion source 10 to operate in a plurality of different modes. These modes include a first single charge operating mode; a second single charge operating mode; and a multicharged operating mode. Each of these modes will be described in more detail.

The first single charge mode is similar to that described above. In this mode, the controller 180 controls the first valve 171 to open allowing the flow of the first gas, which is a halogen containing gas, into the arc chamber 100. The controller 180 also controls the actuator 200 such that the solid target 190 is within the arc chamber, as shown in FIG. 2A. The solid target 190 is etched and single charged ions are created, as described above. Thus, in the first single charge mode, the metal is introduced only by the solid target 190.

Likewise, the multicharge mode is similar to that described above. In this mode, the controller 180 controls the second valve 176 to open allowing the flow of the second gas, which may be a gas containing the metal, carbon and optionally a halogen, into the arc chamber 100. The controller 180 also controls the actuator 200 such that the solid target 190 is within the arc chamber, as shown in FIG. 2A. The metal is introduced by both the second gas and the solid target 190, resulting in a metal-rich plasma that creates many multicharged ions, as described above.

In the second single charge mode, the controller 180 removes the solid target 190 from the arc chamber 100 by retracting the actuator 200, as shown in FIG. 2B. Further, in this mode, the controller controls the second valve 176 to allow the flow of the second gas into the arc chamber 100. The second gas is ionized producing metal ions having mostly single charges. Further, the halogen in the second gas serves to recycle metal from the walls of the arc chamber 100. Thus, in this second single charge mode, the metal is introduced only by the second gas.

Figure 4:
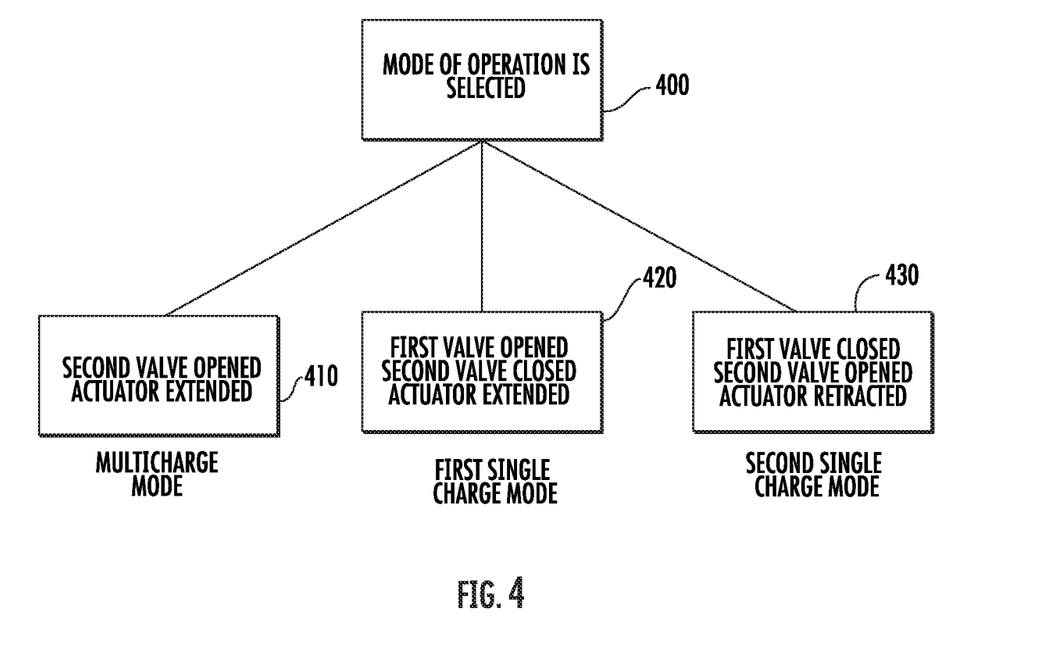
FIG. 4 shows the operation of the controller using the embodiment of FIGS. 2A-2B.

FIG. 4 shows the operation of the controller 180 to control the modes of the ion source 10 when the solid target 190 is retractable. As shown in Box 400, a desired mode of operation is selected, which may depend on the recipe that is being used. This mode may be selected by the operator or user. Alternatively, the controller 180 may automatically select the most appropriate mode based on the desired beam current and charge state. Based on this selection, the controller 180 manipulates the first valve 171, the second valve 176 and the actuator 200 to achieve the desired mode of operation.

As shown in Box 410, the multicharge mode may be selected, where plasma conditions are optimized for the generation of multicharged metal ions. In response, the controller 180 extends the actuator 200 into the arc chamber 100 so that the solid target 190 is disposed within the arc chamber 100. The controller 180 also opens the second valve 176 to allow the flow of the second gas, which may be a gas comprising the metal, carbon and optionally a halogen, into the arc chamber 100. In this mode, the second gas contains metal. Further, the halogen from the second gas serves to etch the solid target 190, adding more metal to the plasma. In some embodiments, the first gas may also be introduced into the arc chamber 100 to further etch the solid target 190. This metal-rich plasma is effective at creating multicharged ions.

Alternatively, as shown in Box 420, the first single charge mode may be selected, where the majority of metal ions have a single charge. In response, the controller 180 extends the actuator 200 so that the solid target 190 is disposed within the arc chamber 100. The controller 180 also opens the first valve 171 to allow the flow of the first gas, which is a halogen containing gas, into the arc chamber 100. In this mode, the plasma causes the gas to ionize and etch the solid target 190, where the majority of the ions that are created are single charged ions.

Additionally, as shown in Box 430, the second single charge mode may be selected, where the majority of metal ions have a single charge. In response, the controller 180 retracts the actuator 200 so that the solid target 190 is disposed outside the arc chamber 100, as shown in FIG. 2B. The controller 180 also opens the second valve 176 to allow the flow of the second gas, into the arc chamber 100. In this mode, mostly single charged ions are created, as the second gas is the only source of metal.

Thus, to operate in the multicharge mode, the controller 180 configures the ion source 10 such that the metal is introduced by the second gas and the solid target. To operate in the single charge mode, the controller 180 configures the ion source 10 such that the metal is introduced by only one of the second gas or the solid target 190.

While the above disclosure describes the use of a ceramic material that contains aluminum as the solid target 190 and a second gas that contains aluminum, other metals may be used as well. In these embodiments, a different organometallic gas may be used. For example, the metal may be gallium. In this embodiment, solid target may be gallium oxide, and the second gas may be an organogallium gas. In another embodiment, the metal may be indium. In this embodiment, the solid target 190 may be indium oxide, and the second gas may be an organoindium gas. In another embodiment, the metal may be lanthanum. In this embodiment, the solid target may be lanthanum fluoride, lanthanum oxide, or lanthanum hexaboride, and the second gas may be an organolanthanide gas, such as cyclopentadienyl lanthanide.

The embodiments described above in the present application may have many advantages. First, the creation of an ion source that can operate in a plurality of modes is advantageous, as the same ion source may be used to create single charged ions and multicharged ions. Additionally, the combination of a crucible and a solid target has additional benefits.

First, the organoaluminium gas is available in gas containers, allowing long life and easy replacement. The organoaluminium gas also effectively creates single charged aluminum ions. Finally, the halogens in the organoaluminium gas also act as an etchant to keep aluminum from accumulating on the walls of the arc chamber 100.

Second, the solid target 190 has a long life, such that it does not need to be replaced often. Additionally, when the solid target 190 is etched, it creates mostly single changed ions.

Thus, this ion source is capable of producing single charged or multicharged ions of a selected species, where that species is a metal, such as aluminum, gallium, indium or lanthanum.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode ion source, comprising:
an arc chamber, comprising a plurality of walls and adapted to contain a solid target;
an indirectly heated cathode disposed in the arc chamber;
a first valve in communication with the arc chamber and a first gas source;
a second valve in communication with the arc chamber and a second gas source; and
a controller in communication with the first valve and the second valve so as to operate the indirectly heated cathode ion source in one of a plurality of modes,
wherein the plurality of modes comprises a single charge mode to create ions of a species having a single charge and a multicharge mode to create ions of the species having two or more charges.

2. The indirectly heated cathode ion source of claim 1, wherein the species comprises a metal.

3. The indirectly heated cathode ion source of claim 1, wherein in the single charge mode, the controller opens the first valve and closes the second valve.

4. The indirectly heated cathode ion source of claim 1, wherein in the multicharge mode, the controller closes the first valve and opens the second valve.

5. The indirectly heated cathode ion source of claim 1, further comprising the solid target.

6. The indirectly heated cathode ion source of claim 5, wherein the solid target is mounted on one of the plurality of walls.

7. The indirectly heated cathode ion source of claim 5, wherein the solid target is mounted on an end of the arc chamber opposite the indirectly heated cathode.

8. The indirectly heated cathode ion source of claim 5, wherein the solid target comprises a ceramic material comprising a metal and the metal is also a component of a second gas contained in the second gas source.

9. The indirectly heated cathode ion source of claim 8, wherein the metal is aluminum and the ceramic material is aluminum oxide or aluminum nitride.

10. The indirectly heated cathode ion source of claim 1, wherein the first gas source contains a halogen containing species and the second gas source contains dimethylaluminum chloride or trimethylaluminum chloride.

11. The indirectly heated cathode ion source of claim 1, further comprising a retractable arm on which the solid target is disposed, and wherein the plurality of modes comprises a second single charge mode to create ions of a species having a single charge, wherein in the second single charge mode, the controller retracts the retractable arm and opens the second valve.

12. A method of operating an indirectly heated cathode ion source in a plurality of modes, wherein the indirectly heated cathode ion source comprises a controller, and an arc chamber adapted to contain a solid target comprising a metal, the method comprising:
selecting a desired mode of operation; and
using the controller to configure the indirectly heated cathode ion source to operate in the desired mode,
wherein to operate in a multicharge mode, wherein the multicharge mode is used to create ions of a species having two or more charges, the solid target is disposed in the arc chamber and the controller enables a flow of a first gas containing the metal into the arc chamber; and
wherein to operate in a single charge mode, wherein the single charge mode is to create ions of the species having a single charge, the controller either removes the solid target from the arc chamber or uses a second gas to generate a plasma.

13. The method of claim 12, wherein the second gas comprises a halogen containing species.

14. The method of claim 12, wherein the metal is aluminum and the solid target is aluminum oxide or aluminum nitride.

15. The method of claim 14, wherein the first gas containing the metal comprises DMAC or TMAC.

16. An indirectly heated cathode ion source, comprising:
an arc chamber, comprising a plurality of walls and adapted to contain a solid target;
an indirectly heated cathode disposed in the arc chamber, wherein the indirectly heated cathode is used to generate a plasma in the arc chamber; and
a controller configured to operate the indirectly heated cathode ion source in one of a plurality of modes, wherein the plurality of modes comprises a single change mode and a multicharged mode, and wherein in multicharge mode, the controller configures the indirectly heated cathode ion source such that two sources of a metal are used in a generation of a plasma.

17. The indirectly heated cathode ion source of claim 16, wherein the metal is aluminum, the solid target comprises aluminum oxide or aluminum nitride and wherein a gas containing aluminum and carbon is introduced into the arc chamber when operating in the multicharge mode.

18. The indirectly heated cathode ion source of claim 16, wherein the controller controls an actuator so as to insert and remove the solid target from the arc chamber.

19. The indirectly heated cathode ion source of claim 16, wherein in a single charge mode, only one of the two sources is introduced into the arc chamber.

* * * * *